United States Patent [19]
Griswold et al.

[11] Patent Number: 5,273,589
[45] Date of Patent: Dec. 28, 1993

[54] METHOD FOR LOW PRESSURE RINSING AND DRYING IN A PROCESS CHAMBER

[76] Inventors: Bradley L. Griswold, 1662 Westhaven Dr., San Jose, Calif. 95132; Syed A. Husain, 2022 Stratford Dr., Milpitas, Calif. 95035

[21] Appl. No.: 911,408
[22] Filed: Jul. 10, 1992
[51] Int. Cl.$^5$ .............................................. B08B 3/00
[52] U.S. Cl. ........................................ 134/21; 134/11; 134/31; 134/95.2; 134/105; 134/108; 134/902
[58] Field of Search .................... 134/21, 11, 12, 95.2, 134/10; 8/149.3; 148/DIG. 17

[56] References Cited
U.S. PATENT DOCUMENTS

| | | | |
|---|---|---|---|
| 4,079,522 | 3/1978 | Ham | 34/1 |
| 5,115,576 | 3/1992 | Roberson, Jr. et al. | 34/15 |

*Primary Examiner*—Mark L. Bell
*Assistant Examiner*—Thomas G. Dunn, Jr.
*Attorney, Agent, or Firm*—Thomas E. Schatzel

[57] ABSTRACT

An embodiment of the present invention is a system for rinsing and drying items comprising a process chamber for receiving the items; a rinse condenser; a first heater; a vaporizer for vaporizing water and including a second heater; a vacuum system for reducing the pressure within the process chamber; and a valving apparatus for independently coupling the process chamber to the vaporizer and the process chamber to the vacuum system. A controller sequences the first and second heaters and the valving apparatus such that the pressure within the process chamber is substantially reduced below atmospheric pressure, the rinse condenser is turned on, water is introduced to the vaporizer which is turned to water vapor by turning the second heater on, the water vapor is circulated to the process chamber, the water vapor is condensed on the items and the rinse condenser, the condensate water is allowed to rain on the items, the water condensate is returned from the process chamber to the vaporizer, the process chamber is isolated from the vaporizer, the rinse condenser is turned off, the first heater is turned on, the vacuum system operates to remove water vapor from the process chamber, and atmospheric pressure is restored to the process chamber when the items are dry of water.

6 Claims, 2 Drawing Sheets

METHOD FOR LOW PRESSURE RINSING AND DRYING IN A PROCESS CHAMBER

BACKGROUND OF THE INVENTION

1. Field of the Invention

The present invention relates generally to the manufacture of precision electronic and mechanical components, and more specifically to apparatus used in processing semiconductor integrated circuits, modules, hard disk drive components and media, and biomedical devices and apparatus that rinse and dry such components after chemical processing or cleaning.

2. Description of the Prior Art

A common process used more than once and throughout the manufacture of semiconductor integrated circuits, multi-chip modules, and hard-disk magnetic media, is the rinsing and drying of such components after each step of the chemical processing steps. Typically, the rinse must be capable of removing ionic contamination and the devices must be dried residue-free. The object of rinsing and drying is to remove contamination. Thus, a rinsing or drying step that adds particulates or other contaminates is unacceptable.

Presently, the spin rinse dryer is widely used in the industry. In this system, the devices to be rinsed and dried are spun on their axes, or placed on a rotor and spun around the rotor axis. The devices are then typically sprayed with high-purity, deionized (DI) water. This is followed by spinning in a heated atmosphere of high purity nitrogen. The drying rate is accelerated by the combination of centrifugal force that throws the water rinse off the device and evaporation. Although the spin-rinse dryer has been improved over the years, it nevertheless has a number of shortcomings which have been exacerbated by the ever decreasing geometries appearing in state-of-the-art electronic devices. Spin-rinse dryers can actually generate particulates, due to their rotating parts. Extraordinary measures must be taken to eliminate these generated particles from processing systems. Spin-rinse dryers also require a tooling change for changes in component sizes or shapes. The residue-free drying performance of spin-rinse systems is highly dependent on the maintenance attention given to the machine and the quality of the incoming water.

A number of alternative methods have been introduced, each with its own set of new problems. The most common of these alternative methods is the alcohol dryer, which does not provide a rinse to remove ionic contaminates. The alcohol dryer works by displacing water with alcohol through the condensation of hot alcohol vapor on a device surface. The drying then depends on evaporation of the condensed alcohol. A major issue with alcohol dryers is safety. One particular system on the market has resorted to the use of seventeen different safety interlocks to make the unit safe. The reliability of such a dryer is in doubt because the complexity invites failures. A similar dryer has been marketed that uses an exotic, albeit expensive chemical that is much less hazardous than alcohol. Beyond the obvious increase in costs, the effects of the exotic chemicals on devices being processed are not yet completely understood.

Another alternative to the spin-rinse dryer is the meniscus dryer, which pulls devices very slowly from hot high-purity DI water, and relies on surface tension to wick-off substantially all of the water from the device. The remaining water is easily evaporated away. The successful operation of this system is highly dependent on the size and shape of the devices being processed. It may not be a solution in all cases and can be hard to control in production environments. The corrosive effects of hot DI water used in this dryer are a source of new problems that must be addressed.

Therefore, an improvement in rinsing and drying technology is needed. The present invention overcomes the problems traditionally associated with rinsing and drying.

SUMMARY OF THE PRESENT INVENTION

It is therefore an object of the present invention to provide a rinser and dryer for semiconductor processing and other critical applications that performs residue-free and is safe to operate.

Briefly, an embodiment of the present invention is a system for rinsing and drying devices comprising a process chamber for receiving the devices; a rinse condenser; an infrared first heater; a vaporizer for vaporizing water and including a second heater; a vacuum system for reducing the pressure within the process chamber; and a valving means for independently coupling the process chamber to the vaporizer and the process chamber to the vacuum system. A process and control means sequences the first and second heaters and the valving means such that the pressure within the process chamber is substantially reduced below atmospheric pressure, turns the rinse condenser on, introduces a flow of water to fill the vaporizer, generates water vapor by turning on the second heater, circulates the water vapor to the process chamber, condenses the water vapor with the rinse condenser, allows the condensate water to rain on the devices, returns the water condensate from the process chamber to the vaporizer, isolates the process chamber from the vaporizer by closing valves, turns the rinse condenser off, turns the first heater on, operates the vacuum system to remove water vapor from the process chamber, and restores atmospheric pressure to the process chamber when the devices are dry of water.

An advantage of the present invention is that it provides a system and method in which the devices being processed remain stationary during the rinsing and drying cycles reducing damage and breakage of the devices.

A further advantage of the present invention is that a system and method is provided in which there are no moving parts within the process chamber, hence particulate generation is greatly reduced, if not completely eliminated.

Another advantage of the present invention is that a system and method is provided in which the tooling is not dependent on the size and shape of the devices being processed. If a device fits in the process chamber, it can generally be rinsed and dried. This provides greater flexibility for the user.

Another advantage of the present invention is that a system and method are provided which uses water only and uses no other chemicals during either the rinsing or drying cycles.

Another advantage of the present invention is that a system and method are provided which generates its own supply of distilled high purity water at point of use as a by-product of the technology. This is essential to insuring a residue-free dry.

Another advantage of the present invention is that a system and method are provided in which the operating temperature is relatively low (approximately 105° F.). Concerns about the corrosive effects of hot high purity water are thereby eliminated.

Another advantage of the present invention is that it provides a rinsing technology that uses a combination of vapor and liquid, which assures an adequate rinse even for narrow, high aspect ratio device geometries, due to the penetration of vapor into such geometries.

Another advantage of the present invention is that a system and method are provided in which reduced pressure and infrared heating in the drying cycle eliminates the need to use large quantities of high purity nitrogen. A small amount of nitrogen is used only to bring the system back to atmospheric pressure once the processing has been completed.

Another advantage of the present invention is that a system and method are provided which is mechanically simple and uses well-proven, off-the-shelf components, thus making maintenance quick and simple.

These and other objects and advantages of the present invention will no doubt become obvious to those of ordinary skill in the art after having read the following detailed description of the preferred embodiments which are illustrated in the various drawing figures.

DETAILED DESCRIPTION OF THE PREFERRED EMBODIMENTS

Figure 1:
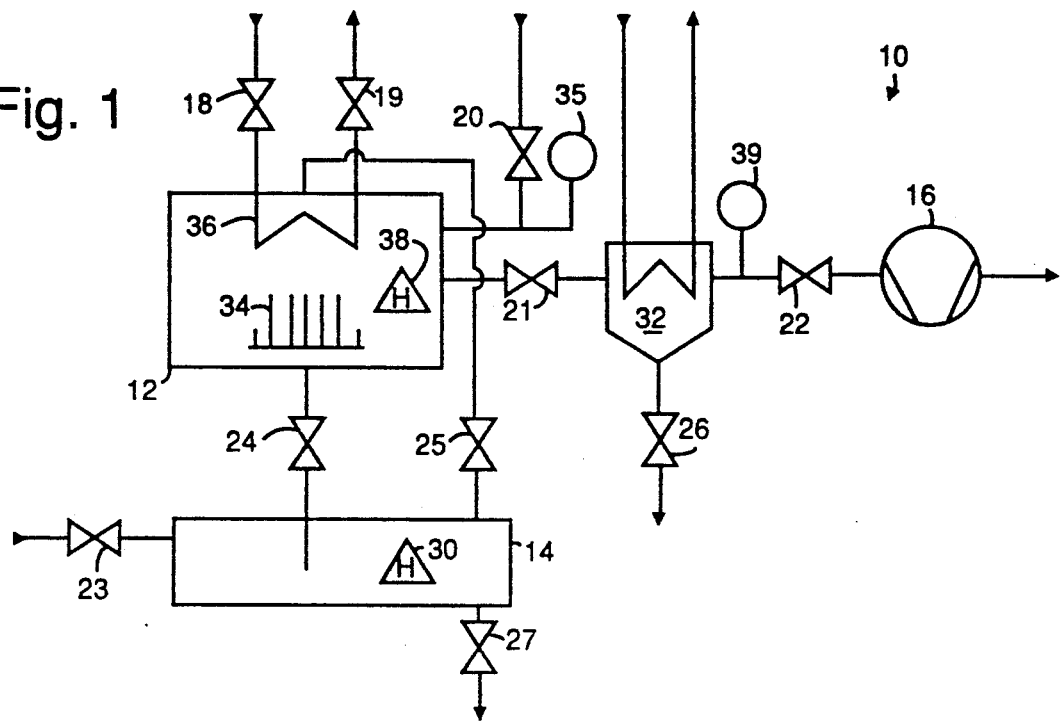
FIG. 1 is a diagram of a vacuum rinser/dryer system embodiment of the present invention.

Silicon wafers, magnetic disk media used in hard disk drives, hybrid circuit substrates, and biomedical devices are a few of the examples of items that require ultra clean rinsing and residue-free drying during their manufacture. The present invention provides such a system, an embodiment of which is illustrated in FIG. 1 and referred to by the general reference numeral 10.

System 10 comprises three major assemblies: a process chamber 12, a vaporizer 14, and a vacuum pumping system 16. For the purposes of the following description of operation, assume that each and all of a plurality of valves 18–27 are initially closed. Also assume that both vaporizer 14 and process chamber 12 are at atmospheric pressure and vaporizer 14 has been filled with deionized water through valve 23 and is being maintained at a temperature of approximately 105° Fahrenheit by a heater 30. Chilled water is circulated at a maximum temperature of 41° Fahrenheit through a pump condenser 32 and vacuum pump 16 is on and running.

A tray carrying a plurality of components 34 to be rinsed and dried is placed into process chamber 12. Components 34, for example, silicon wafers, would typically be wet from a previous processing step. However, it is not necessary that components 34 be wet for the proper operation of system 10. The door of the process chamber 12 is closed and the vacuum pumping system is engaged by opening valves 21 and 22. A gauge 35 displays the degree of vacuum that exists within process chamber 12. The pressure in the process chamber 12 is reduced to less than twelve torr. Valve 21 is throttled until the pressure in chamber 12 rises one or two torr. This insures that the pumping rate is reduced to match the rate of leaks and outgassing in process chamber 12. It also minimizes the amount of water vapor that can be pumped from process chamber 12 during a rinse cycle. Valves 18 and 19 are opened, allowing chilled water to flow through a rinse condenser 36 in process chamber 12. The temperature of rinse condenser 36 is reduced to approximately 41° Fahrenheit. Valve 25 is opened, allowing a water vapor to flow from vaporizer 14 into process chamber 12. After approximately one minute, valve 24 is opened, which provides a return path for a water vapor condensate in process chamber 12 to circulate back to vaporizer 14. The one minute delay in opening valve 24 allows the pressure between vaporizer 14 and process chamber 12 to equalize, eliminating liquid in vaporizer 14 from back-flowing into process chamber 12. The pressure in process chamber 12 will rise to approximately sixty torr, which equals the vapor pressure of water at 105° Fahrenheit. Water vapor condenses on rinse condenser 36 and components 34. The liquid water will rain from rinse condenser 36 onto the components, thus flooding them with distilled (ultra pure) water.

The rain is the principal mechanism of the rinse cycle of system 10 and serves two purposes. The rain water rinses components 34 with ultra pure, distilled water, and it cools components 34. The cooling promotes still more water vapor to condense directly onto components 34. This rinsing action is allowed to continue for a period tailored to the type of components being rinsed.

The drying cycle begins by closing valves 24 and 25 simultaneously, which isolates vaporizer 14 from process chamber 12. Valves 18 and 19 are also closed, which stops the flow of chilled water to rinse condenser 36 and thus ends the rinse cycle because condensation ceases. Valve 21 is opened completely, which allows vacuum pumping system 16 to operate at full capacity. A quartz infrared heater 38 is turned on causing water to evaporate from components 34 and the inside walls of process chamber 12. The temperature of components 34 may drop due to evaporative cooling, but infrared heater 38 is sized to provide sufficient energy to continue the evaporation process until components 34 are dry and no liquid water remains on them. The operational wavelength of the infrared heaters are preferably selected to promote maximum absorption of heat by water molecules, thus minimizing any heating of the devices while simultaneously evaporating liquid water. The removed water is collected in pump condenser 32. A gauge 39 displays the degree of vacuum that exists within pump condenser 32. The use of the pump condenser, or a cold trap, speeds the pumping of water vapor and keeps excessive water from getting into the mechanical vacuum pump. This completes the drying cycle.

Infrared heater 38 is shut off and process chamber 12 is brought back up to atmospheric pressure by closing valve 22, then opening valve 20. This isolates the mechanical vacuum pump and allows nitrogen to enter process chamber 12 and pump condenser 32 through valve 20. When process chamber 12 reaches atmospheric pressure, the door to process chamber 12 may be opened and components 34 removed. This completes the system 10 process cycle.

Before running a subsequent system 10 process cycle, the following actions are taken. Valve 25 is opened to bring vaporizer 14 back to atmospheric pressure. Valve 27 is then opened, allowing the deionized water used in the previous cycle to drain. Valve 23 is then opened to refill vaporizer 14 with fresh deionized water. Valve 26 is opened to drain the water collected by pump condenser 32. Valves 25 and 27 are then closed and system 10 is ready for another cycle.

Valves 18–27 and heaters 30 and 38 may be types that are manually operated by a user. However, that may not be practical nor desirable in a commercial manufacturing environment.

Figure 2:
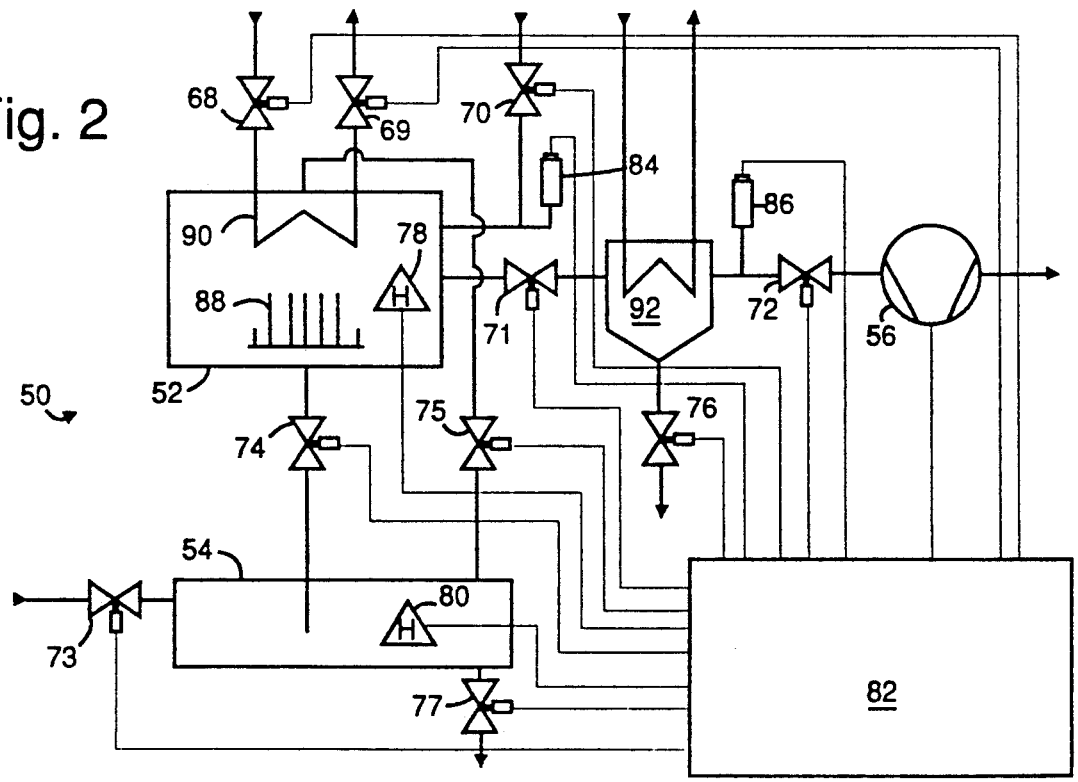
FIG. 2 is a diagram of an automated alternative embodiment of the system of FIG. 1.

FIG. 2 illustrates an automated vacuum rinser/dryer, referred to by the general reference numeral 50. The vacuum rinser/dryer 50 includes a process chamber 52, a vaporizer 54 and a vacuum pump 56. Control of the coupling between process chamber 52 and vaporizer 54 and between process chamber 52 and vacuum pump 56 occurs by a plurality of electrically operated solenoid operated valves 68–77. A pair of heaters 78 and 80 are placed within process chamber 52 and vaporizer 54, respectively. A microcontroller 82 receives analog signals from a pair of pressure transducers 84 and 86 and controls the sequencing of solenoid valves 68–77 and heaters 78 and 80. Heater 78 is a quartz infrared heater. The hardware design of microcontroller 82 is conventional and so is not described in detail herein. A suitable commercially available device that may be used to implement microcontroller 82 is the model 8051 microcomputer sold by Intel Corporation (Santa Clara, Calif.). A tray of items 88 to be rinsed and dried is introduced inside process chamber 52 through a door. A rinse condenser 90 is positioned proximate to items 88. A pump condenser 92 is preferably used between process chamber 52 and vacuum pump 56 to keep water from reaching vacuum pump 56. Otherwise, pump performance may be seriously affected.

Figure 3:
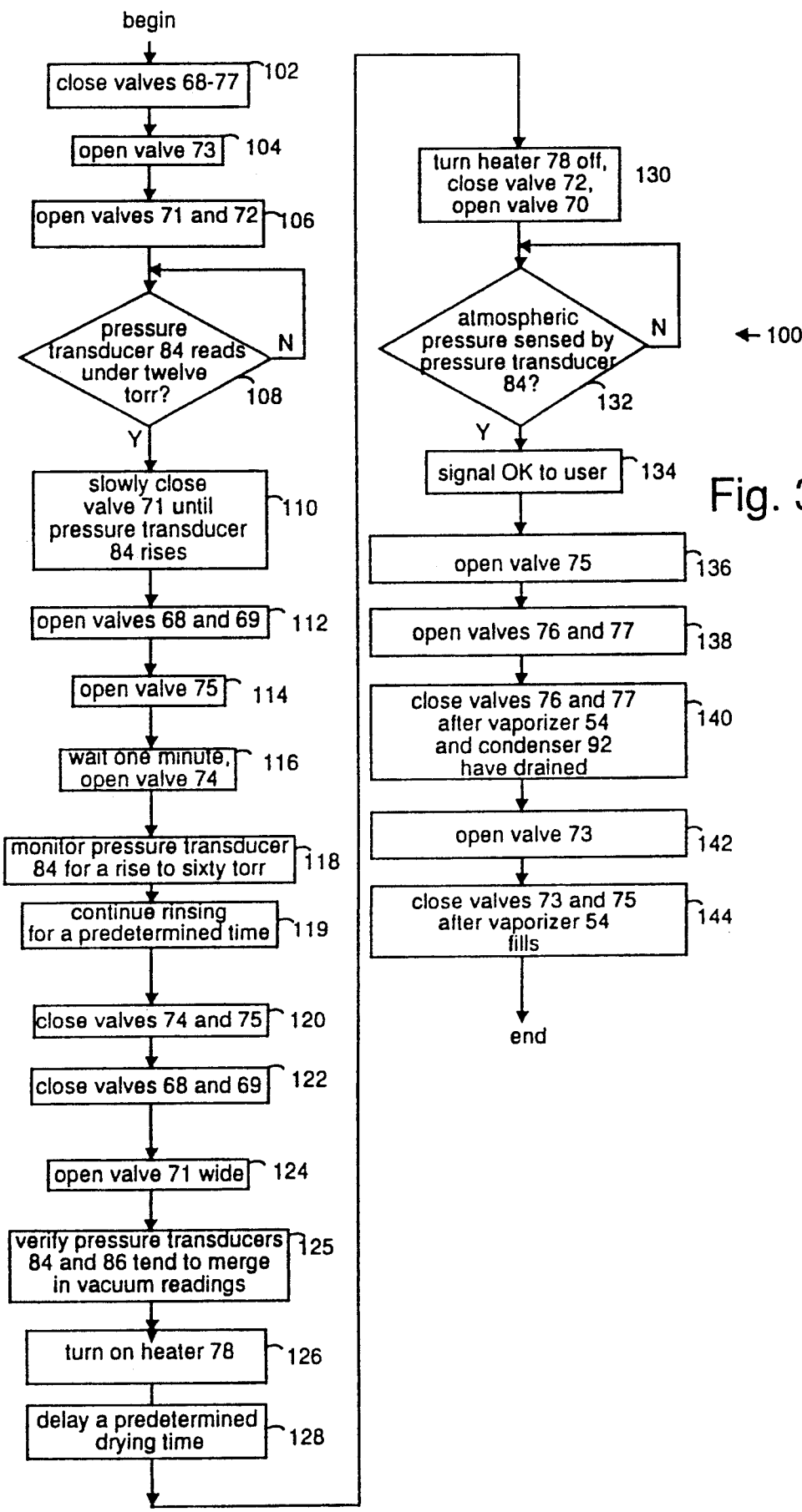
FIG. 3 is a flowchart of a computer-implemented process that runs on the microcontroller included in the system of FIG. 2.

FIG. 3 illustrates with a flowchart a program 100 that may be used to automatically control vacuum rinser/dryer 50. Program 100 is typically converted to machine code and deposited in a program memory storage area provided for this purpose in microcontroller 82. The steps of program 100 are as follows.

A step 102 closes valves 68–77 while both vaporizer 54 and process chamber 52 are at atmospheric pressure. (Vacuum pump 56 is assumed to be on and running.) A step 104 opens solenoid valve 73 and valve 75 to flood vaporizer 54 with deionized water, which is maintained at a temperature of approximately 105° Fahrenheit by heater 80. Chilled water at a maximum temperature of 41° Fahrenheit is circulated through pump condenser 92. A user places items 88 into process chamber 52, and closes a door to process chamber 52. A step 106 opens valves 71 and 72. The pressure in process chamber 52 is reduced to less than twelve torr, as measured by pressure transducer 84, in a step 108. In a step 110, valve 71 is closed slowly until the pressure in chamber 52 rises one or two torr. This insures that the pumping rate is reduced to match the rate of leaks and outgassing in process chamber 52. It also minimizes the amount of water vapor that will be pumped from process chamber 52 during a rinse cycle. A step 112 opens valves 68 and 69, allowing chilled water 32 to flow through rinse condenser 90. The temperature of rinser condenser 90 is reduced to approximately 41° Fahrenheit. A step 114 opens valve 75, allowing a water vapor to flow from vaporizer 54 into process chamber 52. A step 116 delays approximately one minute and opens valve 74 which provides a return path for a water vapor condensate in process chamber 52 to circulate back to vaporizer 54. The one minute delay in opening valve 74 allows the pressure between vaporizer 54 and process chamber 52 to equalize. The pressure in process chamber 52 will then rise to approximately sixty torr, which equals the vapor pressure of water at 105° Fahrenheit, and may be monitored by pressure transducer 84 in a step 118. Liquid water condenses on rinse condenser 90 and items 88. Water also will rain from rinse condenser 90 onto items 88, thus flooding them with (ultra pure) distilled water. This rinsing action is allowed to continue in a step 119 for a period tailored to the type of items 88 being rinsed.

In a step 120, the drying cycle begins by closing valves 74 and 75 simultaneously, which isolates vaporizer 54 from process chamber 52. In a step 122, valves 68 and 69 are also closed, which stops the flow of chilled water to rinse condenser 90 and thus ends the rinse cycle because condensation ceases. In a step 124, valve 71 is opened completely, which allows vacuum pump 56 to operate at full capacity. The vacuums at pressure transducers 84 and 86 may be observed to approach one another, in a step 125. In a step 126, quartz infrared heater 78 is turned on causing water to evaporate from items 88 and the inside walls of process chamber 52. The temperature of items 88 may drop due to evaporative cooling, but infrared heater 78 is sized to provide sufficient energy to continue the evaporation process until items 88 are dry and no liquid water remains on them. A simple time delay in a step 128 may be used to assure that items 88 have dried. Water thus vaporized is collected in pump condenser 92. This completes the drying cycle and heater 78 is turned off in a step 130.

By shutting infrared heater 78 off, process chamber 52 is brought back up to atmospheric pressure by also closing valve 72 and opening valve 70 in step 130. This isolates vacuum pump 56 and allows air or nitrogen to enter process chamber 52 and pump condenser 92 through valve 70. In a step 132, pressure transducer 84 senses when process chamber 52 finally reaches atmospheric pressure, and signals in a step 134 to a user that the door to process chamber 52 may be opened by the user and the items 88 removed. This completes the process cycle.

Before running a subsequent process cycle, the following actions are taken. In a step 136, valve 75 is opened to bring vaporizer 54 back to atmospheric pressure. In a step 138 valves 76 and 77 are opened, allowing the water to drain from pump condenser 92 and vaporizer 54. In a step 140, valves 76 and 77 are closed after vaporizer 54 and condenser 92 have drained. In a step 142, valve 73 is opened to fill vaporizer 54 with fresh deionized water. In a final step 144, valves 73 and 75 are closed after vaporizer 54 fills and the system 50 is ready for the next cycle.

In the embodiments described herein, the raining of ultra pure distilled water on the devices can be improved by using a shell type rinse condenser and having the pressure differential to impinge a stream of vapor and liquid on the devices. Thus a mechanical (kinetic) energy is imparted to dislodge particles and residue.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of rinsing and drying an object-to-be-rinsed-and-dried in a process chamber that includes a rinse condenser and a first heater, a vaporizer for vaporizing water that includes a second heater, a vacuum system for reducing the pressure within the process chamber, and valving means for independently coupling the process chamber to the vaporizer and the process chamber to the vacuum system, the method comprising the steps of:

sequencing said first and second heaters and said valving means wherein the pressure within said process chamber is substantially reduced below atmospheric pressure by said vacuum system;

chilling said rinse condenser;

vaporizing a flow of water to said vaporizer into a water vapor with said second heater operated to maintain a water vapor temperature of approximately 105° Fahrenheit;

circulating said water vapor to said process chamber;

condensing said water vapor with said rinse condenser positioned for a condensation of water to fall on an object-to-be-rinsed-and-dried;

returning said water condensate from said process chamber to said vaporizer;

isolating said process chamber from said vaporizer;

discontinuing chilling said rinse condenser and operating said first heater to dry said object-to-be-rinsed-and-dried;

removing with said vacuum system said water vapor from said process chamber; and restoring atmospheric pressure to said process chamber when said object-to-be-rinsed-and-dried is dry of water.

2. A method of rinsing and drying an object-to-be-rinsed-and-dried, the method comprising the steps of:

reducing the pressure of gases surrounding said object-to-be-rinsed-and-dried;

directing a water vapor at a temperature of approximately 105° Fahrenheit to a rinse condenser that is positioned proximate to said object-to-be-rinsed-and-dried wherein said water vapor condenses on the condenser and rains on said object-to-be-rinsed-and-dried to rinse it;

heating water molecules surrounding said object-to-be-rinsed-and-dried wherein said water molecules are vaporized; and removing said water vapor with a vacuum pump wherein said object-to-be-rinsed-and-dried is dried of water.

3. The method of claim 2, further comprising the step of:

restoring the pressure of gases surrounding said object-to-be-rinsed-and-dried to atmospheric with at least one of air and purified nitrogen.

4. A method of rinsing and drying in a process chamber with low temperature water vapor and liquid, the method comprising the steps of:

reducing the pressure within said process chamber to a pressure that is substantially below that of atmospheric pressure in order to begin a rinsing sequence;

lowering the temperature of a rinse condenser within said process chamber that is positioned above an object-to-be-rinsed-and-dried;

vaporizing in a vaporizer a liquid water into a water vapor that is maintained at a temperature of approximately 105° Fahrenheit;

coupling said vaporizer to said process chamber wherein said water vapor is allowed to fill said process chamber and thereby raise its internal pressure;

returning a condensate of said water vapor that precipitates in said process chamber by virtue of said rinse condenser being lowered in temperature and falls upon said object to said vaporizer and continuing for the duration of said rinsing sequence;

decoupling said vaporizer from said process chamber to begin a drying sequence;

stopping the lowering of the temperature of said rinse condenser;

vacuum evacuating said process chamber; and heating inside said process chamber wherein said object-to-be-rinsed-and-dried is dried of water.

5. The method of claim 4, wherein:

the step of reducing the pressure is such that the pressure is reduced to less than twelve torr;

the step of lowering the temperature of said rinse condenser includes circulating chilled water through said rinse condenser wherein the temperature of said condenser is reduced to approximately 41° Fahrenheit;

the steps of vaporizing and coupling are such that, during said raising, said internal pressure of said process chamber reaches a maximum of approximately sixty torr; and the step of vacuum evacuating said process chamber includes using a cold trap between a vacuum pump and said process chamber.

6. The method of claim 4, wherein:

the step of reducing the pressure begins after filling said vaporizer connected to said process chamber with deionized water and loading in said object-to-be-rinsed-and-dried at atmospheric pressure and includes opening a valve connected to an operating vacuum pump such that the pressure within said process chamber is reduced to less than twelve torr and then throttling said valve until the pressure rises one or two torr wherein the pumping rate is reduced to match a leakage rate and an outgassing rate within said process chamber;

the step of lowering the temperature of said rinse condenser includes opening a valve to circulate water chilled to about 41° Fahrenheit through said rinse condenser;

the step of vaporizing said liquid water into said water vapor includes operating a heater located within said vaporizer;

the step of coupling said vaporizer to said process chamber includes opening a first valve between said vaporizer and said process chamber wherein water vapor is allowed to flow;

the step of returning said water condensate includes opening a second valve between said vaporizer and said process chamber, after a delay of approximately one minute after opening said first valve to allow the pressure to equalize between said vaporizer and said process chamber, for raising the pressure in said process chamber to approximately sixty torr and for condensing water vapor on said rinse condenser and said object-to-be-rinsed-and-dried for the duration of said rinsing sequence;

the step of decoupling includes closing said first and second valves between said vaporizer and said process chamber;

the step of stopping the lowering of the temperature of said rinse condenser includes closing said valve to circulate said chilled water through said rinse condenser;

the step of vacuum evacuating said process chamber includes opening said valve connected to said operating vacuum pump such that the pressure within said process chamber is reduced; and the step of heating inside said process chamber includes operating a heater located within said process chamber until said drying sequence is completed.

* * * * *